United States Patent
Li et al.

(10) Patent No.: US 10,504,787 B2
(45) Date of Patent: *Dec. 10, 2019

(54) FINFET WITH SLOPED SURFACE AT INTERFACE BETWEEN ISOLATION STRUCTURES

(71) Applicant: Taiwan Semiconductor Manufacturing Company, Ltd., Hsinchu (TW)

(72) Inventors: Chih-Sheng Li, Hsinchu (TW); Hsin-Chieh Huang, Hsinchu (TW); Chi-Wen Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,422

(22) Filed: Dec. 20, 2018

(65) Prior Publication Data

US 2019/0131178 A1    May 2, 2019

Related U.S. Application Data

(60) Continuation of application No. 15/905,429, filed on Feb. 26, 2018, now Pat. No. 10,163,717, which is a
(Continued)

(51) Int. Cl.
*H01L 21/8234* (2006.01)
*H01L 27/088* (2006.01)
(Continued)

(52) U.S. Cl.
CPC .... *H01L 21/823431* (2013.01); *H01L 21/311* (2013.01); *H01L 21/31111* (2013.01);
(Continued)

(58) Field of Classification Search
None
See application file for complete search history.

(56) References Cited

U.S. PATENT DOCUMENTS 7,105,894 B2    9/2006  Yeo et al.
8,476,137 B1    7/2013  LiCausi et al.
(Continued)

FOREIGN PATENT DOCUMENTS

CN    1525530 A    9/2004
CN    102054741 A    5/2011
(Continued)

*Primary Examiner* — Lex H Malsawma
(74) *Attorney, Agent, or Firm* — Slater Matsil, LLP

(57) ABSTRACT

A semiconductor device includes a substrate, a first insulating structure, a second insulating structure, at least one first active semiconductor fin, and at least one second active semiconductor fin. The first insulating structure and the second insulating structure are disposed on the substrate. The first active semiconductor fin is disposed on the substrate and has a protruding portion protruding from the first insulating structure. The second active semiconductor fin is disposed on the substrate and has a protruding portion protruding from the second insulating structure. The protruding portion of the first active semiconductor fin and the protruding portion of the second active semiconductor fin have different heights.

20 Claims, 11 Drawing Sheets

Related U.S. Application Data division of application No. 14/971,907, filed on Dec. 16, 2015, now Pat. No. 9,905,467.

(60) Provisional application No. 62/214,759, filed on Sep. 4, 2015.

(51) Int. Cl.
*H01L 21/311* (2006.01)
*H01L 21/3115* (2006.01)
*H01L 21/8238* (2006.01)
*H01L 27/092* (2006.01)

(52) U.S. Cl.
CPC ......... *H01L 21/31116* (2013.01); *H01L 21/823493* (2013.01); *H01L 27/0886* (2013.01); *H01L 21/31155* (2013.01); *H01L 21/823481* (2013.01); *H01L 21/823821* (2013.01); *H01L 21/823892* (2013.01); *H01L 27/0924* (2013.01)

(56) References Cited

U.S. PATENT DOCUMENTS

| | | |
|---|---|---|
| 8,659,072 B2 | 2/2014 | Ou et al. |
| 9,312,363 B2 | 4/2016 | Liu et al. |
| 9,318,367 B2 | 4/2016 | Huang et al. |
| 9,418,994 B1 | 8/2016 | Chao et al. |
| 9,905,467 B2 * | 2/2018 | Li .................. H01L 21/823431 |
| 10,163,717 B2 * | 12/2018 | Li .................. H01L 21/823431 |
| 2005/0104096 A1 | 5/2005 | Lee et al. |
| 2007/0108537 A1 | 5/2007 | Anderson et al. |
| 2008/0265338 A1 | 10/2008 | Yu et al. |
| 2009/0090976 A1 | 4/2009 | Kavalieros et al. |
| 2009/0321834 A1 | 12/2009 | Rachmady et al. |
| 2011/0097889 A1 | 4/2011 | Yuan et al. |
| 2011/0121406 A1 | 5/2011 | Lee et al. |
| 2013/0052781 A1 | 2/2013 | Dai et al. |
| 2013/0059445 A1 | 3/2013 | Shao et al. |
| 2013/0237039 A1 | 9/2013 | Sleight et al. |
| 2014/0239404 A1 | 8/2014 | Huang et al. |
| 2014/0291770 A1 | 10/2014 | Yin et al. |
| 2014/0306317 A1 | 10/2014 | Licausi |
| 2016/0343623 A1 * | 11/2016 | Fogel ............. H01L 21/823878 |

FOREIGN PATENT DOCUMENTS

| | | |
|---|---|---|
| CN | 102420145 A | 4/2012 |
| KR | 1020110056225 A | 5/2011 |
| KR | 20130025314 A | 3/2013 |

* cited by examiner

FINFET WITH SLOPED SURFACE AT INTERFACE BETWEEN ISOLATION STRUCTURES

PRIORITY CLAIM AND CROSS-REFERENCE

This application is a continuation of U.S. patent application Ser. No. 15/905,429, filed on Feb. 26, 2018 entitled "Method of Forming FinFET Device by Adjusting Etch Selectivity of Dielectric Layer", which is a divisional of U.S. patent application Ser. No. 14/971,907, filed on Dec. 16, 2015, and entitled "Semiconductor Device and Manufacturing Method Thereof", now U.S. Pat. No. 9,905,467, issued on Feb. 27, 2018, which claims priority to U.S. Provisional Patent Application No. 62/214,759 filed on Sep. 4, 2015, and entitled "N/PMOS IMPLANT INDUCED FIN HEIGHT LOADING EFFECT," which applications are incorporated herein by reference.

BACKGROUND

Semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
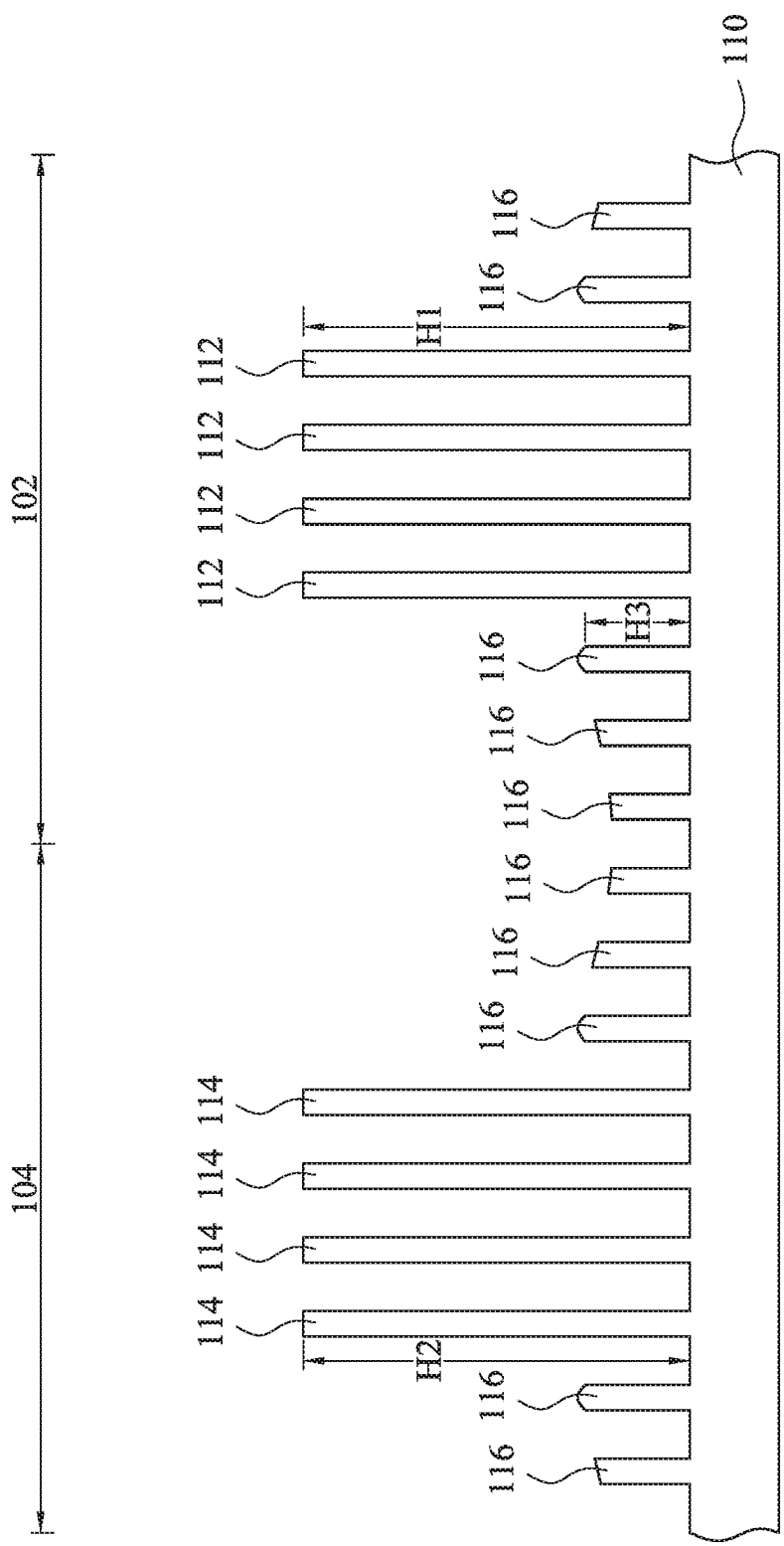
FIGS. 1A to 1H are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a FinFET device. The FinFET device, for example, may be a complementary metal-oxide-semiconductor (CMOS) device including at least one P-type metal-oxide-semiconductor (PMOS) FinFET device and at least one N-type metal-oxide-semiconductor (NMOS) FinFET device. The following disclosure will continue with a FinFET example to illustrate various embodiments of the present application. It is understood, however, that the application should not be limited to a particular type of device.

FIGS. 1A to 1H are cross-sectional views of a method for manufacturing a semiconductor device at various stages in accordance with some embodiments of the present disclosure. Reference is made to FIG. 1A. A substrate 110 is provided. The substrate 110 has at least one first region 102 and at least one second region 104. For example, in FIG. 1A, the substrate 110 has one first region 102 and one second region 104 adjacent to the first region 102. In some embodiments, the first region 102 and the second region 104 are different regions selected from the group consisting essentially of a logic core region, a memory region (such as an embedded static random access memory (SRAM) region), an analog region, an input/output (also referred to as a peripheral) region, a dummy region (for forming dummy patterns), and the like. In some embodiments, the first region 102 is an n-type FinFET region, while the second region 104 is a p-type FinFET region, or vice versa. In alternative embodiments, the first region 102 is a logic core region, while the second region 104 is an IO region, or vice versa.

In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

A plurality of semiconductor fins are formed on the substrate 110. In greater detail, the semiconductor fins includes at least one first active semiconductor fin 112 and at least one second active semiconductor fin 114. For example, in FIG. 1A, there are four of the first active semiconductor fins 112 and four of the second active semiconductor fins 114. The first active semiconductor fins 112 are formed on the first region 102 of the substrate 110, and the second active semiconductor fins 114 are formed on the second region 104 of the substrate 110. In some embodiments, the first active semiconductor fins 112 and the second active semiconductor fins 114 include silicon. It is note that the numbers of the first active semiconductor fins 112 and the second active semiconductor fins 114 in FIG. 1A are illustrative, and should not limit the claimed scope of the present disclosure. A person having ordinary skill in the art may select suitable numbers for the first active semiconductor fins 112 and the second active semiconductor fins 114 according to actual situations.

The first active semiconductor fins 112 and the second active semiconductor fins 114 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the first active semiconductor fins 112 and the second active semiconductor fins 114 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some embodiments, at least one dummy semiconductor fin 116 is formed on the substrate 110. For example, in FIG. 1A, there are ten dummy semiconductor fins 116. The dummy semiconductor fins 116 can be disposed in the first region 102 and/or the second region 104 of the substrate 110, and can be disposed between the first active semiconductor fins 112 and the second active semiconductor fins 114. The dummy semiconductor fins 116 have no functionality in the semiconductor device but make the device processes more uniform, more reproducible, and more manufacturable. The first active semiconductor fins 112 and the second semiconductor fins 114 have functionality in the semiconductor device.

The dummy semiconductor fins 116 can be formed with the first active semiconductor fins 112 and the second active semiconductor fins 114. In greater detail, a plurality of semiconductor fins with substantially equal spaced and substantially the same height are formed on the substrate 110 in advanced. Additional lithography and etch operations are performed to remove (or cut) some of the fins, referred to as the dummy semiconductor fins 116. The lithography and etch operation can be performed once or multiple times. The uncut semiconductor fins are referred to as the first active semiconductor fins 112 and the second active semiconductor fins 114. That is, the heights H1 of the first active semiconductor fins 112 and the second active semiconductor fins H2 114 are greater than the heights H3 of the dummy semiconductor fins 116. This operation can prevent different fin line profile including both critical dimensions and sidewall profile angle. However, in some other embodiments, the dummy semiconductor fins 116 can be omitted. In some embodiments, the heights H1 and/or the heights H2 are about 100 nm to about 150 nm, and the claimed scope is not limited in this respect.

Figure 1B:
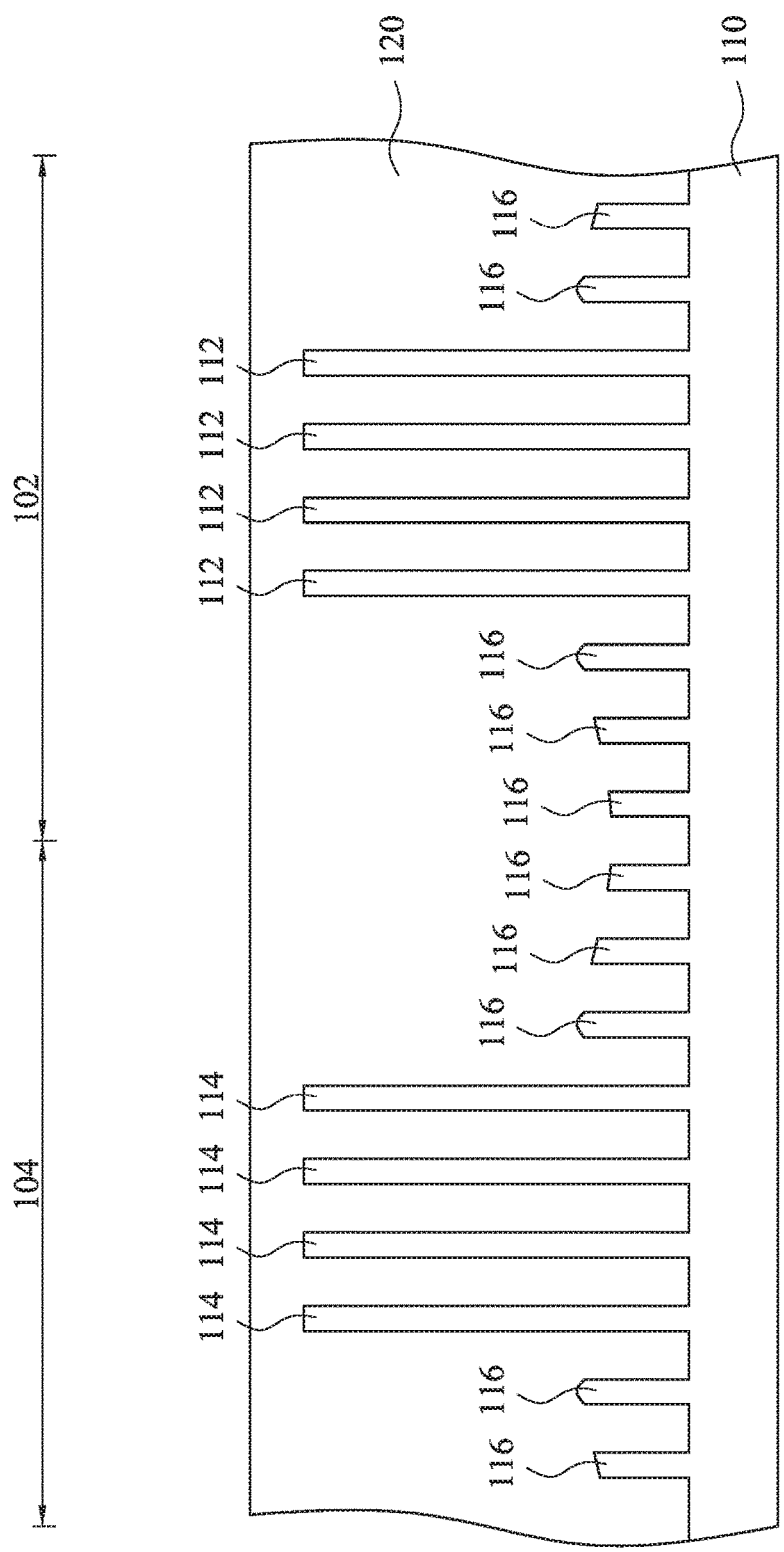

Reference is made to FIG. 1B. Dielectric material 120 is disposed on the substrate 110 and covers the first active semiconductor fins 112, the second active semiconductor fins 114, and the dummy semiconductor fins 116. In some embodiments, the dielectric material 120 includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device.

Figure 1C:
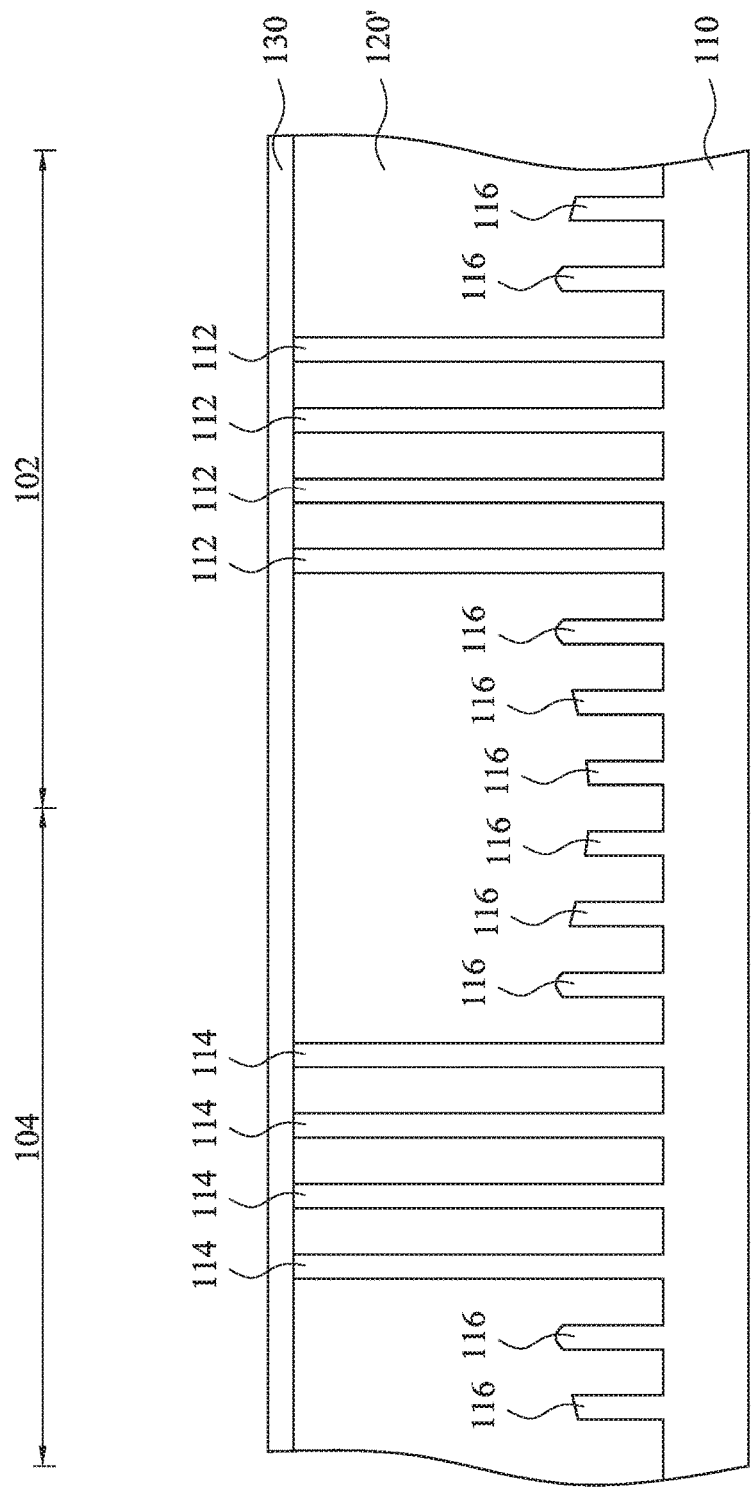

Reference is made to FIG. 1C. A chemical mechanical polish (CMP) is performed to level the top surface of the dielectric material 120 to the top surface of the semiconductor fins (i.e., the first active semiconductor fins 112 and the second active semiconductor fins 114) to form a dielectric layer 120'. In other words, the dielectric material 120' covers the dummy semiconductor fins 116.

A protection layer 130 is formed on the dielectric material 120' and covers the first active semiconductor fins 112 and the second active semiconductor fins 114. The protection layer 130 allows implantation therethrough while preventing damage of the underlying structure (i.e., the first active semiconductor fins 112, the second active semiconductor fins 114, and the dielectric material 120'). Examples of a suitable protection layer 130 may be an oxide layer or include a $SiO_2$ or SiN layer deposited by a CVD process, e.g., MOCVD, or an $Al_2O_3$ layer or a nanolaminate layer, including a material such as $HfO_2$ and/or HfAlO, deposited by ALD.

Figure 1D:
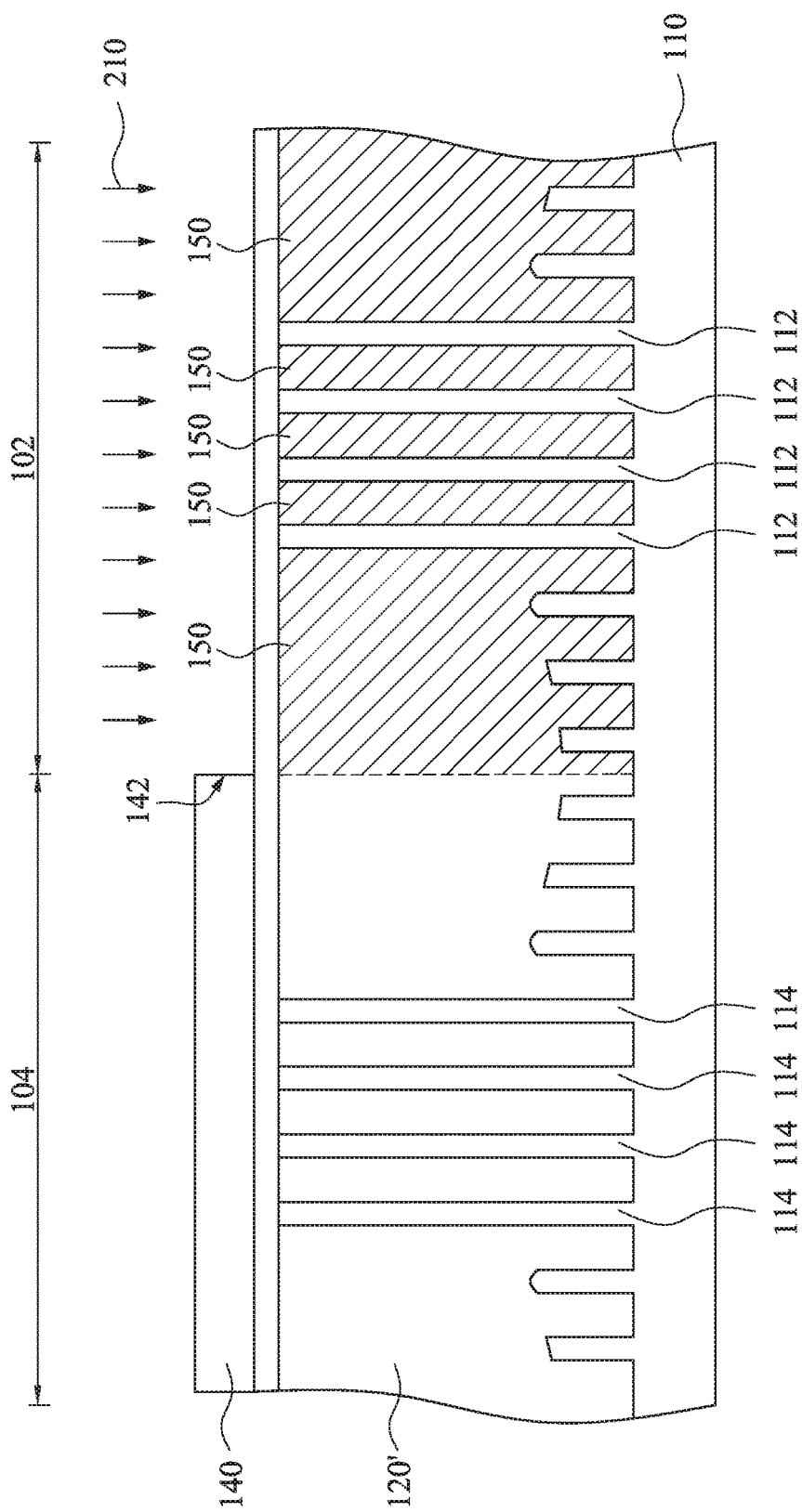

Reference is made to FIG. 1D. A patterned mask layer 140 is formed on the protection layer 130 and the second region 104 of the substrate 110. The patterned mask layer 140 can be a resist layer, which is also referred to as a photoresist layer, photosensitive layer, imaging layer, patterning layer, or radiation sensitive layer. The patterned mask layer 140 includes a positive-type resist material, a negative-type resist material, other type material, or combinations thereof. The patterned mask layer 140 is formed on the protection layer 130 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer. In some embodiments, the lithography process implements an etching process, such as a dry etching, wet etching, other etching method, or combinations thereof. A rinsing process, such as a de-ionized (DI) water rinse, may be performed on the protection layer 130 before forming the patterned mask layer 140.

The patterned mask layer 140 includes an opening 142 that exposes a portion of the protection layer 130 located on the first region 102 of the substrate 110. In FIG. 1D, an ion implantation process (or doping process) 210 is performed on the dielectric layer 120' using the patterned mask layer 140 as a mask. In FIG. 1D, the ion implantation process 210 forms at least one first insulating structure 150 in the dielectric layer 120'. The ion implantation process 210 implants p-type dopants (such as boron (B), indium (In), aluminum (Al), gallium (Ga), IIIA group elements, or combinations thereof). In some embodiments, the first insulating structure 150 is an electrically isolation between semiconductor fins of a semiconductor device, such as a transistor. The ion implantation process 210 is performed at a suitable energy and dosage to achieve desired characteristics of the semiconductor device. In some embodiments, the implant dosage of the ion implantation process 210 is about $8 \times 10^{12}$ ions/cm$^2$ to about $2 \times 10^{14}$ ions/cm$^2$, and the energy of the ion implantation process 210 is about 20 keV to about 120 keV, and the claimed scope is not limited in the respect.

Figure 1E:
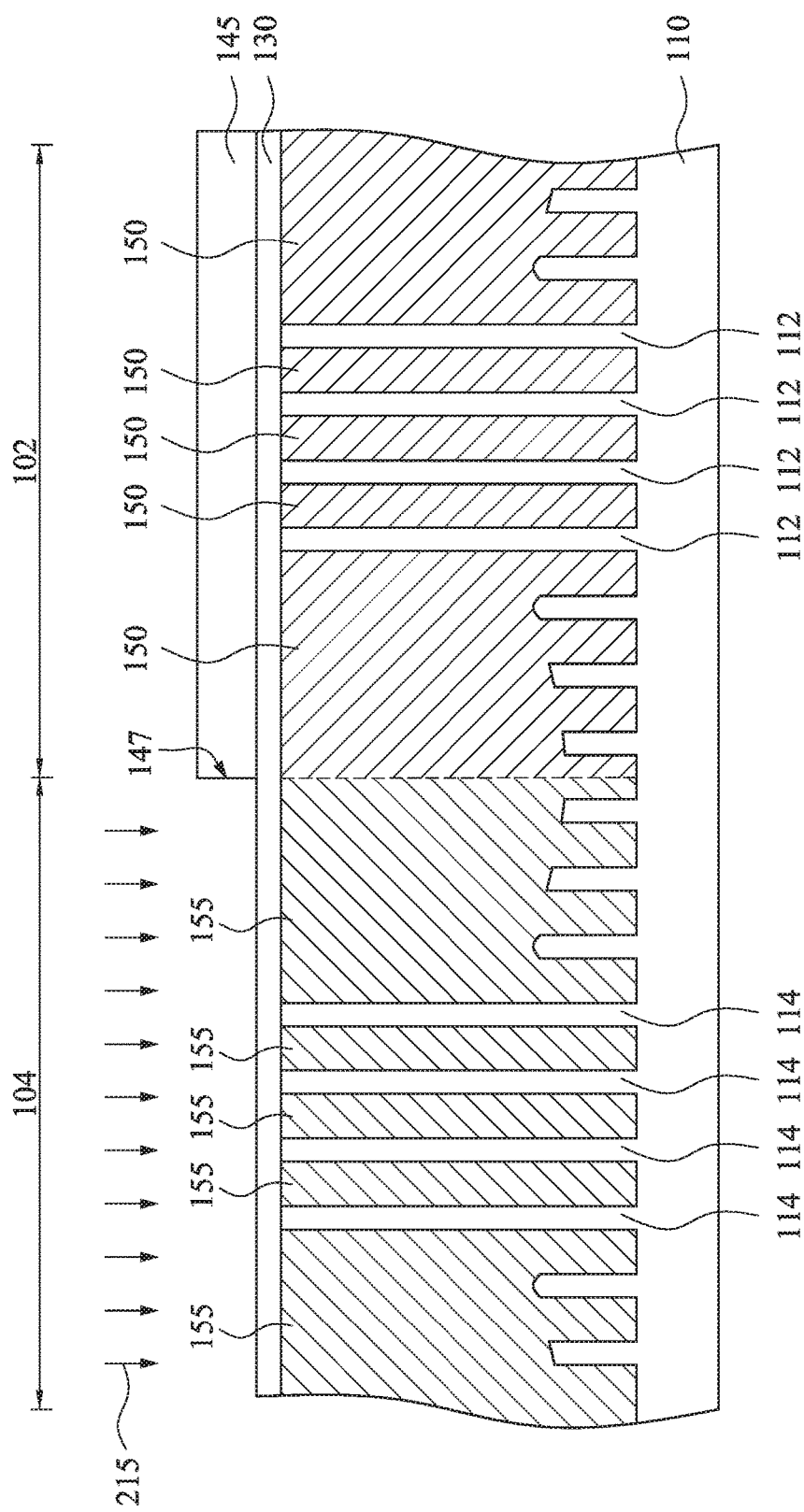

Reference is made to FIG. 1E. The patterned mask layer 140 (see FIG. 1D) is removed. In some embodiments, the patterned mask layer 140 is removed by performing a wet etching process. In some embodiments, wet etch solution for the wet etching process includes a Caros solution, including sulfuric acid ($H_2SO_4$) and peroxide ($H_2O_2$). Alternatively, the patterned mask layer 140 is removed by a chemical solution selected from $O_3$ water, sulfuric acid ($H_2SO_4$) and ozone ($O_3$), $H_2SO_4$ and $H_2O_2$, N-methyl-2-pyrrolidine (NMP), cyclohexanol, cyclopentanol, propylene glycol monomethyl ether (PGME), and Propylene glycol monomethyl ether acetate (PGMEA). In some other embodiment, the patterned mask layer 140 is removed by a chemical solution selected from oxidant based solution. In some embodiments, a cleaning process is performed to clean organic residue or other residues after the removal of the patterned mask layer 140. The cleaning material is capable of removing the organic residue. The cleaning material may include solvent, surfactant or polymer ingredient.

Another patterned mask layer 145 is formed on the protection layer 130 and the first region 102 of the substrate 110. The patterned mask layer 145 can be a resist layer, which is also referred to as a photoresist layer, photosensitive layer, imaging layer, patterning layer, or radiation sensitive layer. The patterned mask layer 145 includes a positive-type resist material, a negative-type resist material, other type material, or combinations thereof. The patterned mask layer 145 is formed on the protection layer 130 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer. In some embodiments, the lithography process implements an etching process, such as a dry etching, wet etching, other etching method, or combinations thereof. A rinsing process, such as a de-ionized (DI) water rinse, may be performed on the protection layer 130 before forming the patterned mask layer 145.

The patterned mask layer 145 includes an opening 147 that exposes a portion of the protection layer 130 located on the second region 104 of the substrate 110. In FIG. 1E, another ion implantation process (or doping process) 215 is performed on the dielectric layer 120' using the patterned mask layer 145 as a mask. In FIG. 1E, the ion implantation process 215 forms at least one second insulating structure 155 in the dielectric layer 120'. The ion implantation process 215 implants n-type dopants (such as nitrogen (N), phosphor (P), arsenic (As), antimony (Sb), VA group elements, or combinations thereof). In some embodiments, the second insulating structure 155 is an electrically isolation between semiconductor fins of a semiconductor device, such as a transistor. The ion implantation process 215 is performed at a suitable energy and dosage to achieve desired characteristics of the semiconductor device. In some embodiments, the implant dosage of the ion implantation process 215 is about $8 \times 10^{12}$ ions/cm$^2$ to about $3 \times 10^{14}$ ions/cm$^2$, and the energy of the ion implantation process 215 is about 20 keV to about 250 keV, and the claimed scope is not limited in the respect.

Figure 1F:
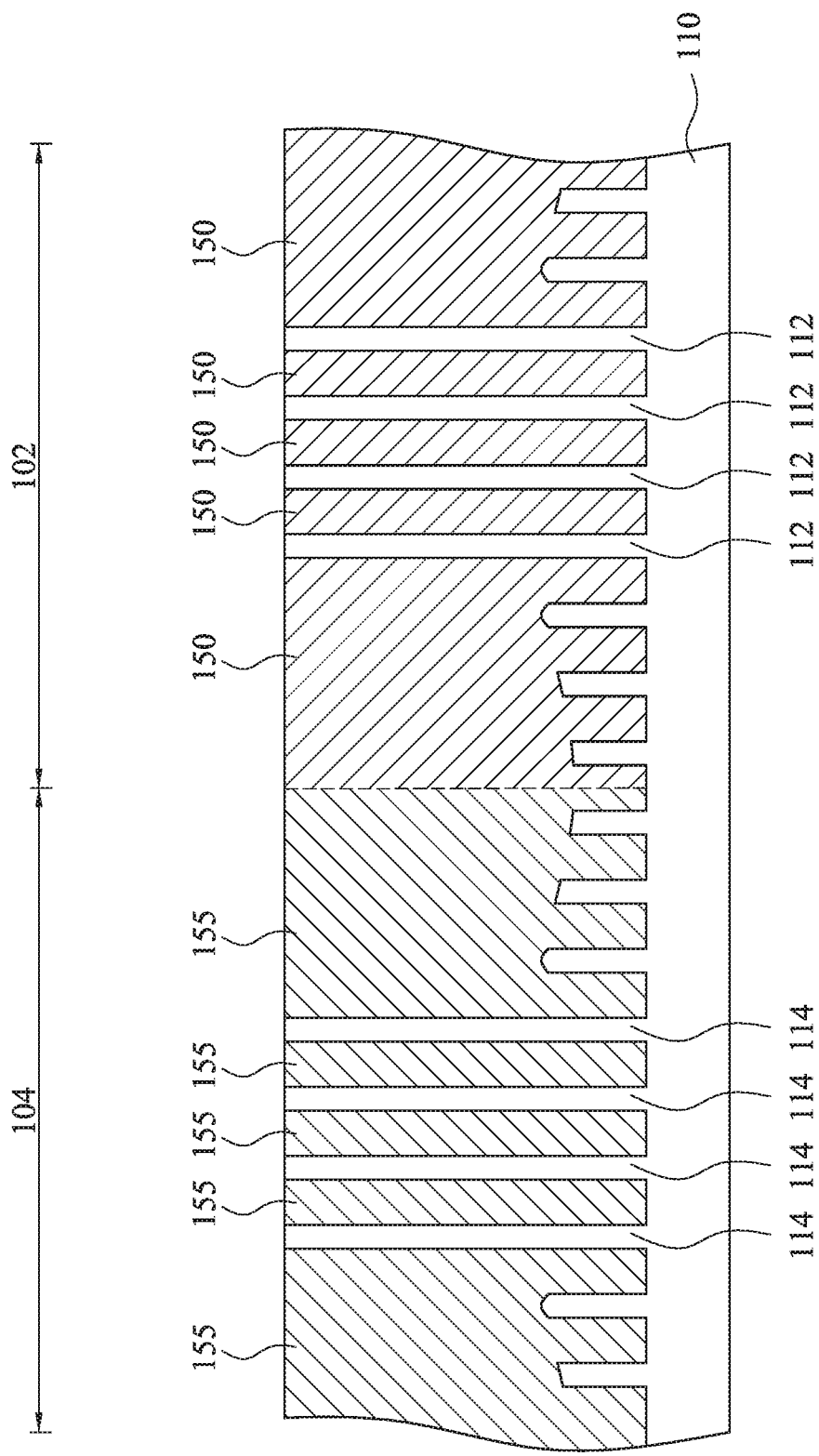

Reference is made to FIG. 1F. The patterned mask layer 145 (see FIG. 1E) and the protection layer 130 (see FIG. 1E) are removed. In some embodiments, the patterned mask layer 145 is removed by performing a wet etching process. In some embodiments, wet etch solution for the wet etching process includes a Caros solution, including sulfuric acid ($H_2SO_4$) and peroxide ($H_2O_2$). Alternatively, the patterned mask layer 140 is removed by a chemical solution selected from $O_3$ water, sulfuric acid ($H_2SO_4$) and ozone ($O_3$), $H_2SO_4$ and $H_2O_2$, N-methyl-2-pyrrolidine (NMP), cyclohexanol, cyclopentanol, propylene glycol monomethyl ether (PGME), and Propylene glycol monomethyl ether acetate (PGMEA). In some other embodiment, the patterned mask layer 145 is removed by a chemical solution selected from oxidant based solution. In some embodiments, a cleaning process is performed to clean organic residue or other residues after the removal of the patterned mask layer 145. The cleaning material is capable of removing the organic residue. The cleaning material may include solvent, surfactant or polymer ingredient.

In some embodiments, an annealing (referred to as diffusion annealing hereinafter) process can be performed after the patterned mask layer 145 is removed. The annealing process is to force the dopants in the first insulating structures 150 and the second insulating structures 155 to diffuse. The diffusion annealing includes commonly used rapid thermal anneal (RTA) and solid phase epitaxy re-growth anneal. As a result of the diffusion annealing, the first insulating structures 150 and the second insulating structures 155 have much uniform dopant distributions.

Figure 1G:
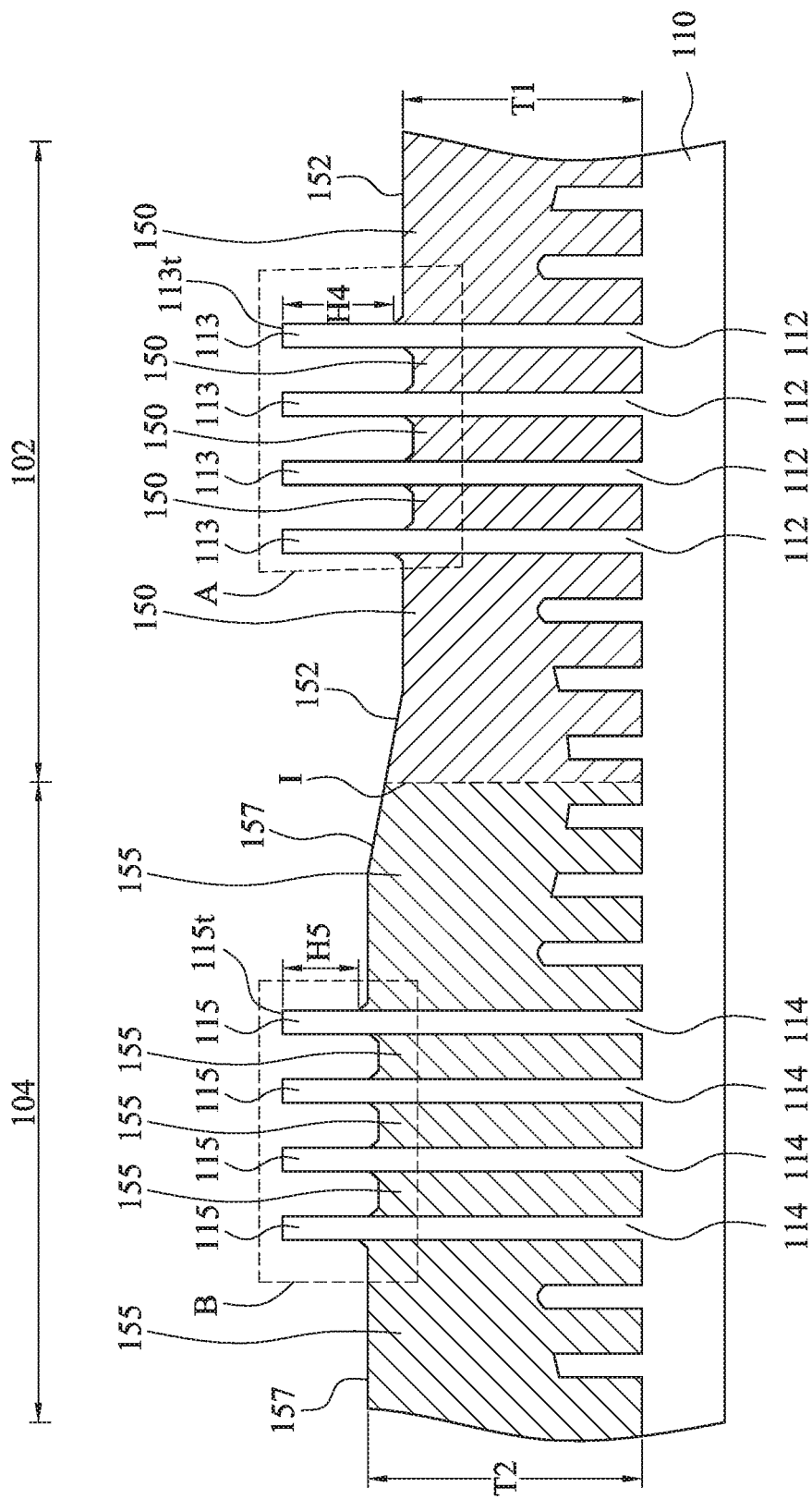

Reference is made to FIG. 1G. The first insulating structures 150 and the second insulating structures 155 are partially removed to expose portions of the first active semiconductor fins 112 and portions of the second active semiconductor fins 114. The exposed portions of the first active semiconductor fins 112 are referred as protrusion portions 113 of the first active semiconductor fins 112, which protrude (or extend) from the first insulating structures 150. The exposed portions of the second active semiconductor fins 114 are referred as protrusion portions 115 of the second active semiconductor fins 114, which protrude (or extend) from the second insulating structures 155.

In some embodiments, the first insulating structures 150 and the second insulating structures 155 are partially removed by using at least one etching process. The etching process can be a wet etching process, a dry etching process, or combinations thereof. The dry etching process can be a high selective etching process, plasma etching process, electron-cyclotron (ECR) plasma etching process, inductively coupled plasma (ICP) etching process, or other suitable etching process. The power of the dry etching process may be about 50 W to about 500 W, and the etching gas may include $C_2F_6$, $CF_4$, $CHF_3$, or $C_3F_8$ with a flow rate of about 20 standard cubic centimeters per minute (sccm) to about 150 sccm, $O_2$ with a flow rate of about 20 sccm to 60 sccm, and He with a flow rate of about 50 sccm to about 200 sccm. The pressure of the dry etching process is about 20 mTorr to about 200 mTorr. The temperature of the dry etching process is between room temperature to about 250° C. The frequency of the dry etching process is about 50 kHz to about 13.56 MHz. The operation time of the dry etching process is about 30 seconds to about 150 seconds. The solution of the wet etching process includes dilute hydrofluoric acid (HF), such as 5:1 HF, 10:1 HF, 25:1 HF, or HF with other suitable ratio. The temperature of the wet etching process is at room temperature. The operation time of the wet etching process is about 5 seconds to about 50 seconds.

Since the first insulating structure 150 and the second insulating structure 155 include different dopants, the etching rates of the first insulating structures 150 and the second insulating structures 155 are different. Hence, the thickness T1 of the first insulating structure 150 is different from the thickness T2 of the second insulating structure 155. For example, in FIG. 1G, the etching rate of the first insulating structures 150 is higher than the etching rate of the second insulating structure 155. Hence, the thickness T1 of the first insulating structure 150 is less than the thickness T2 of the second insulating structure 155. In addition, the top surface 152 of the first insulating structure 150 and the top surface 157 of the second insulating structure 155 are non-coplanar. Furthermore, for the first insulating structure 150 and the second insulating structure 155 disposed adjacent to each other, the top surface 152 of the first insulating structure 150 is sloped at an interface I between the first insulating structure 150 and the second insulating structure 155. Also, the top surface 157 of the second insulating structure 155 is sloped at an interface I between the first insulating structure 150 and the second insulating structure 155.

Moreover, the protrusion portions 113 of the first active semiconductor fins 112 have heights H4 of about 20 nm to about 60 nm, and the protrusion portions 115 of the second active semiconductor fins 114 have heights H5 of about 20 nm to about 60 nm. The height H4 is different from the height H5. For example, the height H4 is greater than the height H5. The difference between the heights H4 and H5 is about 0.3 nm to about 6 nm, or about 0.3% to about 4% of heights H1 and/or H2 (see FIG. 1A). Furthermore, the top surface 113t of the first active semiconductor fin 112 and the top surface 115t of the second active semiconductor fin 114 are substantially coplanar.

Figure 2A:
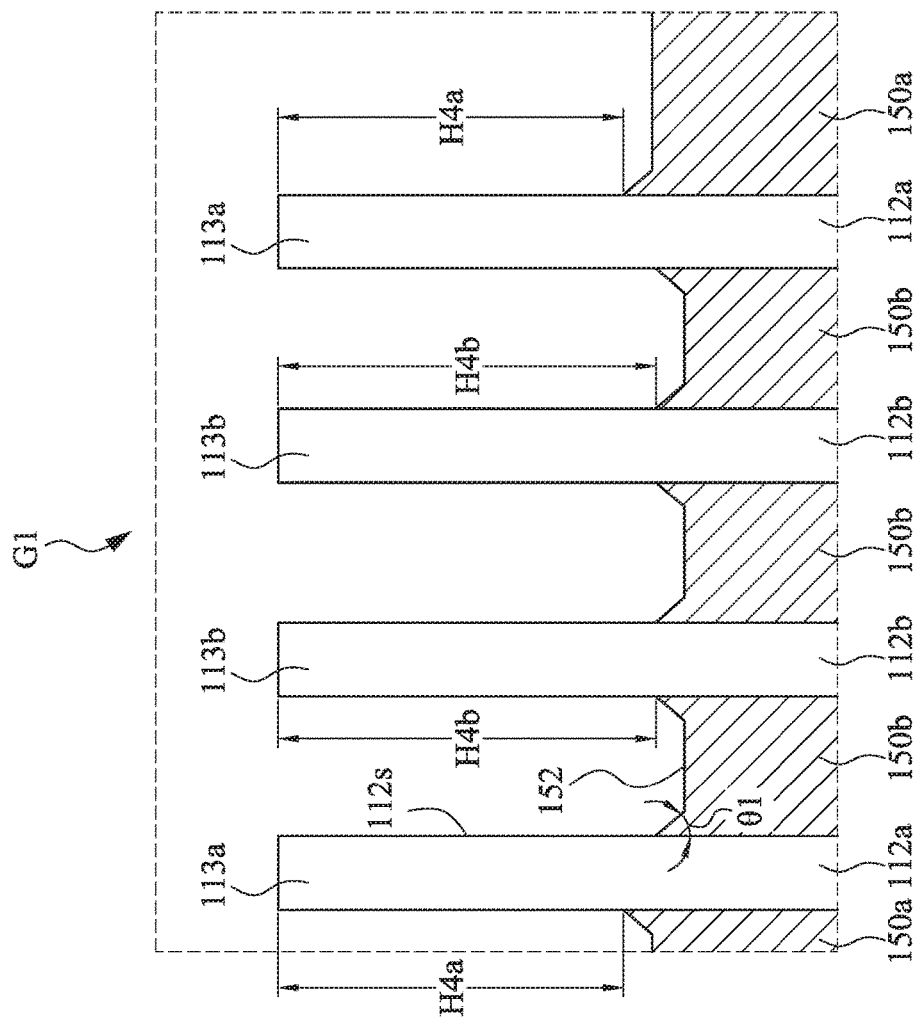
FIG. 2A is an enlarged view of area A in FIG. 1G.

FIG. 2A is an enlarged view of area A in FIG. 1G. In FIG. 2A, the first active semiconductor fins 112 (see FIG. 1G) include outer fins 112a and inner fins 112b disposed between the outer fins 112a. The outer fins 112a and the inner fins 112b form a group G1. The outer fins 112a are disposed at the edges of the group G1. At least one of the protrusion portions 113a of the outer fins 112a has a height H4a of about 20 nm to about 60 nm. At least one of the protrusion portions 113b of the inner fins 112b has a height H4b of about 20 nm to about 60 nm. The height H4b is greater than the height H4a. The height difference between the protrusion portion 113b and 113a (i.e., H4b-H4a) is about 1 nm to about 6 nm or about 7 nm to about 10 nm. In some embodiments, the heights H4b of the protrusion portions 113b of the inner fins 112b are substantially the same.

In addition, the first insulating structures 150 (see FIG. 1G) include outer insulating structures 150a and inner insulating structures 150b disposed between the outer insulating structures 150a. At least one of the inner insulating structures 150b is disposed between adjacent two of the first active semiconductor fins (i.e., the outer fins 112a and/or the inner fins 112b). One of the outer fins 112a is disposed between one of the outer insulating structures 150a and one of the inner insulating structures 150b. In some embodiments, an acute angle θ1 is formed between the top surface 152 of the first insulating structure (i.e., the outer insulating structure 150a and/or the inner insulating structure 150b in this case) and a sidewall 112s of the first active semiconductor fin (i.e., the outer fin 112a and/or the inner fin 112b in this case). In some embodiments, the acute angle θ1 is about 35 degrees to about 55 degrees.

Figure 2B:
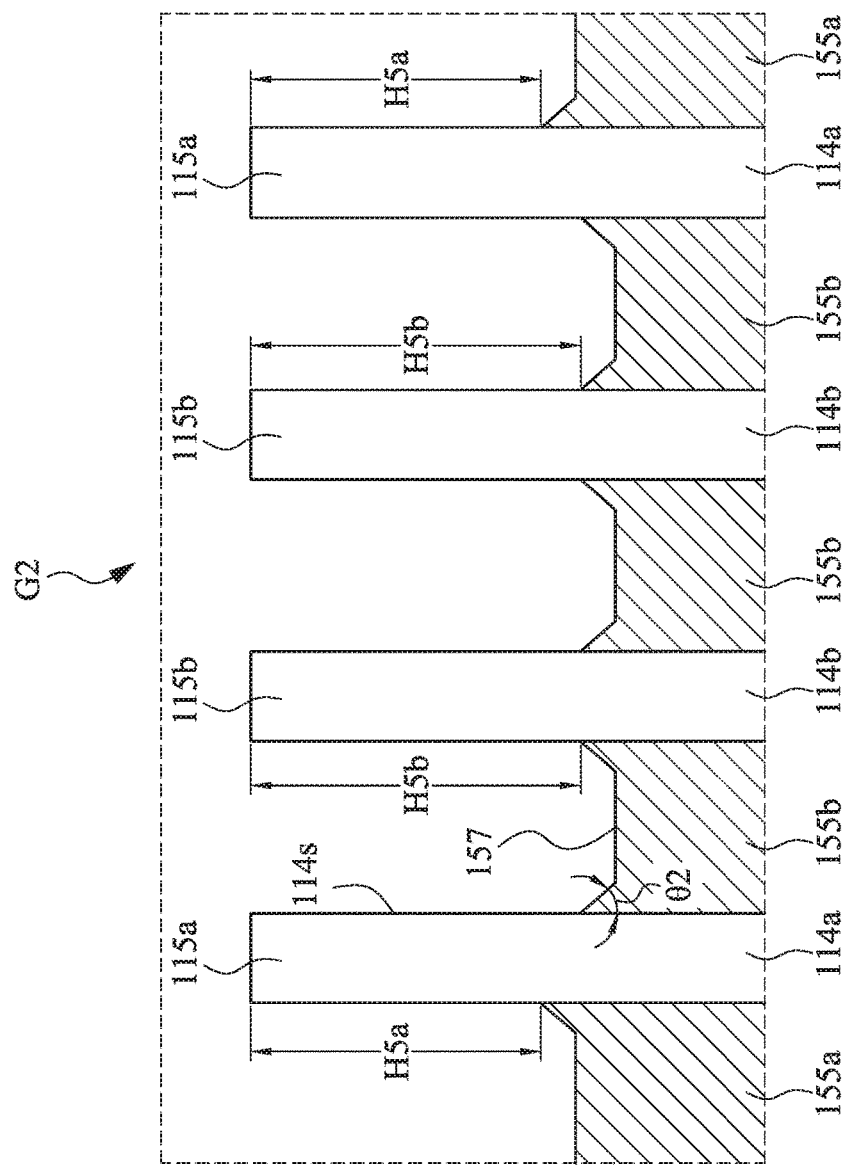
FIG. 2B is an enlarged view of area B in FIG. 1G.

FIG. 2B is an enlarged view of area B in FIG. 1G. In FIG. 2B, the second active semiconductor fins 114 (see FIG. 1G) include outer fins 114a and inner fins 114b disposed between the outer fins 114a. The outer fins 114a and the inner fins 114b form a group G2. The outer fins 114a are disposed at the edges of the group G2. At least one of the protrusion portions 115a of the outer fins 114a has a height H5a of about 20 nm to about 60 nm. At least one of the protrusion portions 115b of the inner fins 114b has a height H5b of about 20 nm to about 60 nm. The height H5b is greater than the height H5b. The height difference between the protrusion portion 115b and 115a (i.e., H5b-H5a) is about 1 nm to about 6 nm or about 7 nm to about 10 nm. In some embodiments, the heights H5b of the protrusion portions 115b of the inner fins 114b are substantially the same.

In addition, the second insulating structures 155 (see FIG. 1G) include outer insulating structures 155a and inner insulating structures 155b disposed between the outer insulating structures 155a. At least one of the inner insulating structures 155b is disposed between adjacent two of the second active semiconductor fins (i.e., the outer fins 114a and/or the inner fins 114b). One of the outer fins 114a is disposed between one of the outer insulating structures 155a and one of the inner insulating structures 155b. In some embodiments, an acute angle θ2 is formed between the top surface 157 of the second insulating structure (i.e., the outer insulating structure 155a and/or the inner insulating structure 155b in this case) and a sidewall 114s of the second active semiconductor fin (i.e., the outer fin 114a and/or the inner fin 114b in this case). In some embodiments, the acute angle θ2 is about 35 degrees to about 55 degrees.

Reference is made to FIGS. 2A and 2B. In some embodiments, the height H4a of the protrusion portion 113a of the outer fin 112a is greater than the height H5a of the protrusion portion 115a of the outer fin 114a. The height difference between the protrusion portion 113a and 115a (i.e., H4a-H5a) is about 1 nm to about 6 nm or about 7 nm to about 10 nm. In some embodiments, the height H4b of the protrusion portion 113b of the inner fin 112b is greater than the height H5b of the protrusion portion 115b of the inner fin 114b. The height difference between the protrusion portion 113b and 115b (i.e., H4b-H5b) is about 1 nm to about 6 nm or about 7 nm to about 10 nm.

Figure 1H:
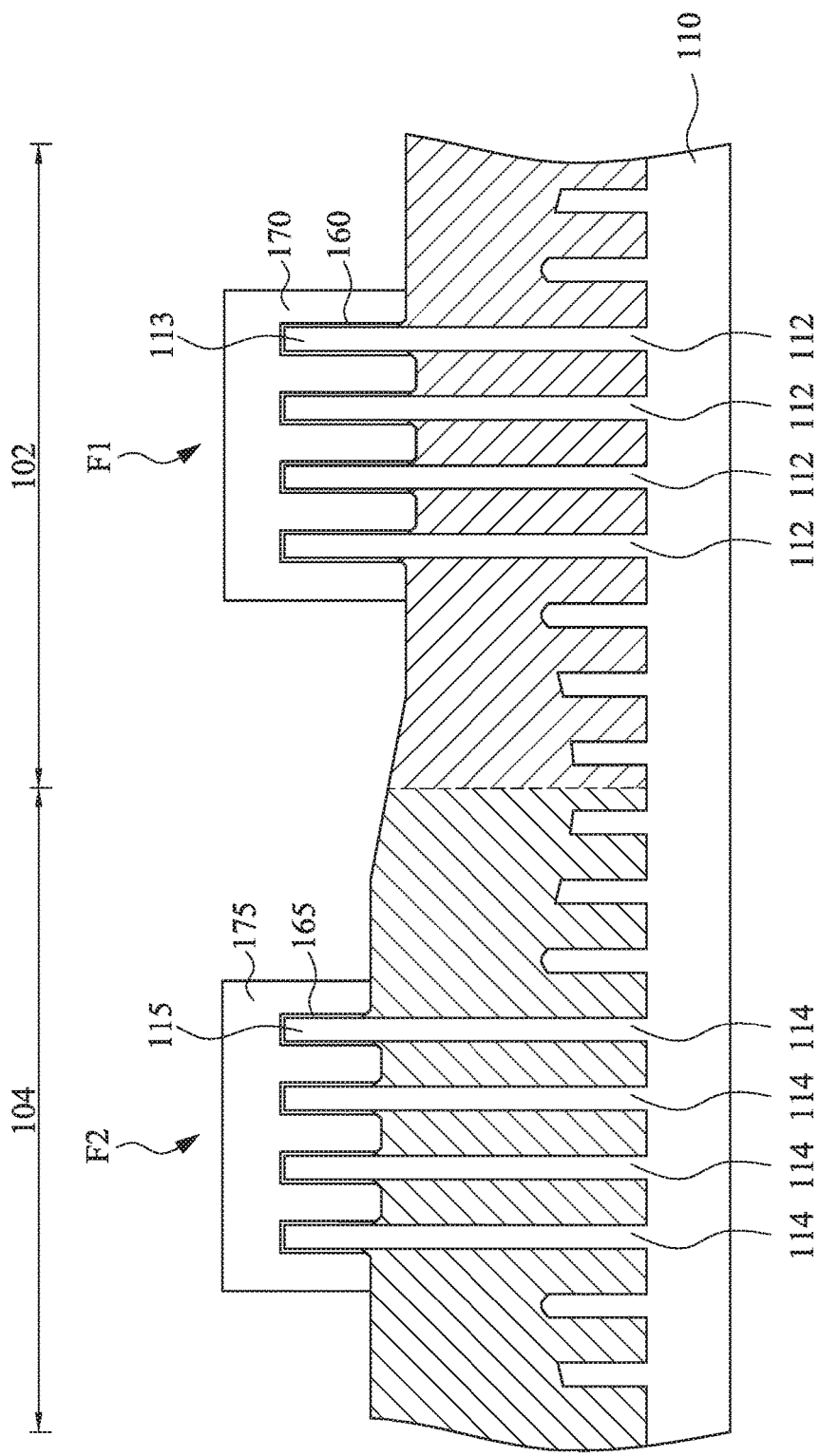

Reference is made to FIG. 1H. Gate dielectrics 160 and 165 are formed to cover the top surface and sidewalls of the protrusion portions 113 of the first active semiconductor fins 112 and the protrusion portions 115 of the first active semiconductor fins 114, respectively. The gate dielectrics 160 and 165 may be formed by thermal oxidation, and hence may include thermal silicon oxide. Gate electrodes 170 and 175 are then formed on the gate dielectrics 160 and 165, respectively. In some embodiments, the gate electrode 170 covers more than one of the first active semiconductor fins 112 to form an n-type FinFET F1, and the gate electrode 175 covers more than one of the second active semiconductor fins 114 to form a p-type FinFET F2. In alternative embodiments, at least one of the first active semiconductor fins 112 and/or the second active semiconductor fins 114 may be used to form one FinFET.

Figure 3:
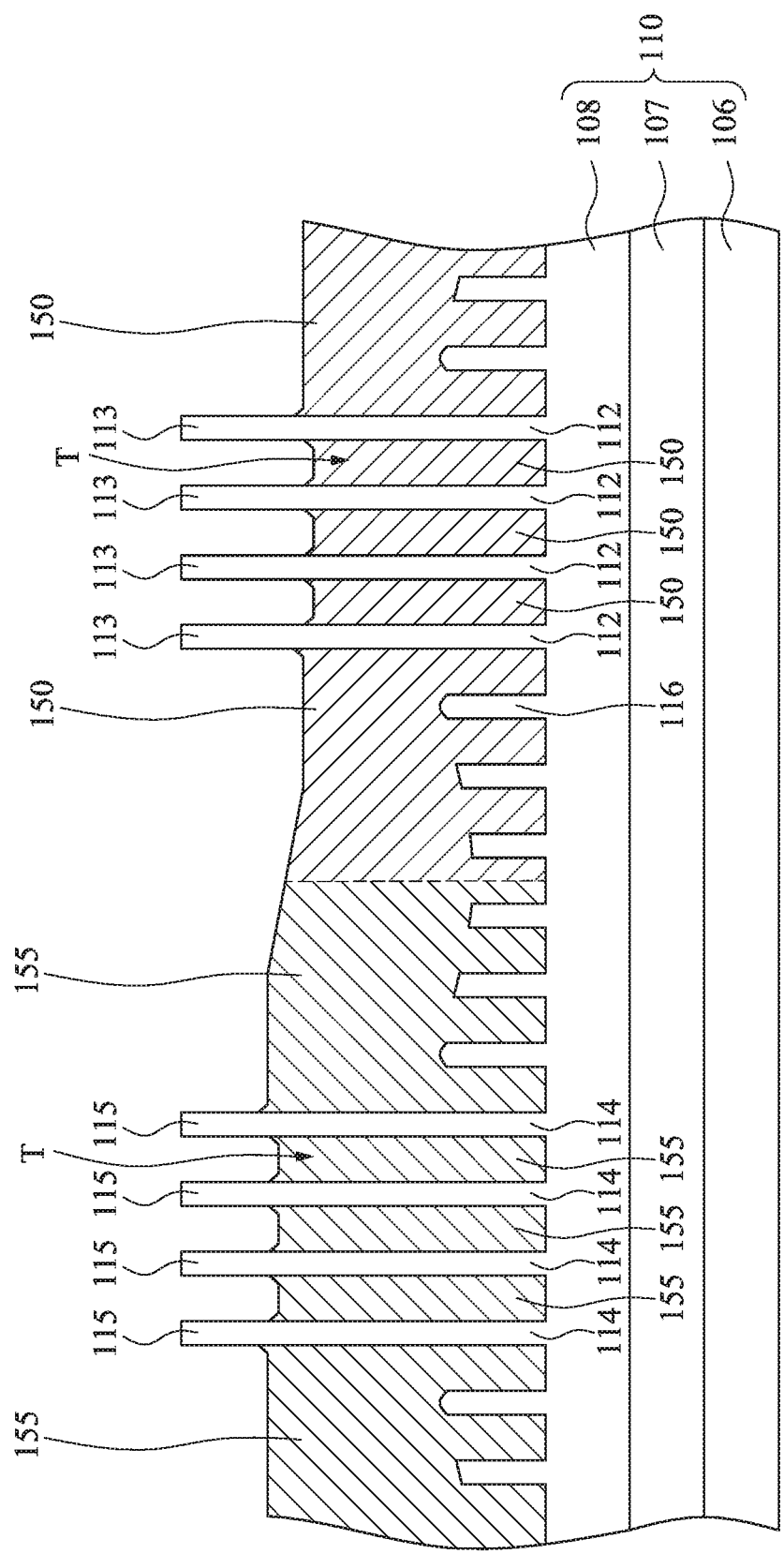
FIG. 3 is a cross-sectional view of a semiconductor device in accordance with some embodiments of the present disclosure.

FIG. 3 is a cross-sectional view of a semiconductor device in accordance with some embodiments of the present disclosure. The difference between the semiconductor devices of FIGS. 1G and 3 is the components of the substrate. In FIG. 3, the substrate 110 includes a first portion 106, a second portion 107, and a third portion 108. The second portion 107 is disposed on the first portion 106, and the third portion 108 is disposed on the second portion 107, such that the first portion 106, the second portion 107, and the third portion 108 are stacked to form the substrate 110. The first portion 106 and the second portion 107 have different material compositions, and the second portion 107 and the third portion 108 have different material compositions. In some embodiments, the first portion 106 and the third portion 108 of the substrate 110 are made of substantially the same material. For example, the first portion 106 and the third portion 108 of the substrate include silicon, such as bulk silicon, and the second portion 107 of the substrate 110 includes silicon, germanium, and oxide, such as SiGeO. Therefore, the first portion 106, the second portion 107, and the third portion 108 form Si/SiGeO/Si stacked layers. Although in FIG. 3, at least one trench T between adjacent semiconductor fins (i.e., the first active semiconductor fins 112, the second active semiconductor fins 114, and the dummy semiconductor fins 116) is formed in the third portion 108 of the substrate 110. That is, the bottom surface of the trench T is higher than the interface of the second portion 107 and the third portion 108 of the substrate 110. However, in some other embodiments, the trench T can expose the second portion 107 of the substrate 110, and the claimed scope is not limited in this respect. Other relevant structural details of the semiconductor device of FIG. 3 are similar to the semiconductor device of FIG. 1G, and, therefore, a description in this regard will not be repeated hereinafter.

According to the aforementioned embodiments, since the first insulating structure and the second insulating structure include different dopants, the etching rates of the first insulating structures and the second insulating structures are different. The height of the protrusion portion of the first active semiconductor fin is different from the height of the protrusion portion of the second active semiconductor fin. That is, with at least one etching process, active semiconductor fins with different heights can be formed. By differentiating fin heights in different device regions, the junction window is increased, which means that the fin heights of FinFETs in different device regions are no longer tied together. With the FinFETs in different device regions having different fin heights, it is easier to tune the performance of devices in different device regions.

According to some embodiments, a semiconductor device includes a substrate, a first insulating structure, a second insulating structure, at least one first active semiconductor fin, and at least one second active semiconductor fin. The first insulating structure and the second insulating structure are disposed on the substrate. The first active semiconductor fin is disposed on the substrate and has a protruding portion protruding from the first insulating structure. The second active semiconductor fin is disposed on the substrate and has a protruding portion protruding from the second insulating structure. The protruding portion of the first active semiconductor fin and the protruding portion of the second active semiconductor fin have different heights.

According to some embodiments, a semiconductor device includes a substrate, a first insulating structure, a second insulating structure, at least one first active semiconductor fin, and at least one second active semiconductor fin. The first insulating structure is disposed on the substrate and includes first dopants. The second insulating structure is disposed on the substrate and includes second dopants different from the first dopants of the first insulating structure. The first active semiconductor fin is disposed on the substrate and extends from the first insulating structure. The second active semiconductor fin is disposed on the substrate and extends from the second insulating structure.

According to some embodiments, a method for manufacturing a semiconductor device includes forming at least one first active semiconductor fin and at least one second active semiconductor fin on a substrate. The substrate has a first region and a second region. The first active semiconductor fin is disposed on the first region of the substrate, and the second active semiconductor fin is disposed on the second region of the substrate. A dielectric layer is formed on the first region and the second region of the substrate. A portion of the dielectric layer on the first portion of the substrate is doped with first dopants to form a first insulating structure. Another portion of the dielectric layer on the second portion of the substrate is doped with second dopants to form a second insulating structure. The second dopants are different from the first dopants. At least a portion of the first insulating structure and at least a portion of the second insulating structure are recessed to expose a portion of the first active semiconductor fin and a portion of the second active semiconductor fin.

One general aspect of embodiments disclosed herein includes a method for manufacturing a semiconductor device including: forming at least one first active semiconductor fin and at least one second active semiconductor fin on a substrate, where the substrate has a first region and a second region, the first active semiconductor fin is disposed on the first region of the substrate, and the second active semiconductor fin is disposed on the second region of the substrate; forming a dielectric layer on the first region and the second region of the substrate; doping a portion of the dielectric layer on the first region of the substrate with first dopants to form a first insulating structure; doping another portion of the dielectric layer on the second region of the substrate with second dopants to form a second insulating structure, where the second dopants are different from the first dopants; and recessing at least a portion of the first insulating structure and at least a portion of the second insulating structure to expose a portion of the first active semiconductor fin and a portion of the second active semiconductor fin.

Another general aspect of embodiments disclosed herein includes a method including: forming a first fin structure and a second fin structure; covering the first fin structure and the second fin structure with a dielectric material; processing a region of the dielectric material to change its etch selectivity characteristics relative to an un-processed region of the dielectric material; and etching a top surface of the dielectric material to expose a first portion of the first fin structure and a second portion of the second fin structure, where the first portion of the first fin structure has a height above the dielectric material greater than a height of the second portion of the second fin structure above the dielectric material.

Yet another general aspect of embodiments disclosed herein includes a method including: patterning a semiconductor substrate to include a first plurality of first protruding structures and a second plurality of second protruding structures; depositing an insulator over the first plurality of first protruding structures and the second plurality of second protruding structures, where the insulator has a first etch rate when exposed to a first etch process; processing a first region of the insulator to change the first etch rate to a second etch rate, different from the first etch rate, when the first region of the insulator is exposed to the first etch process, the first region being over the first plurality of first protruding structures; processing a second region of the insulator to change the first etch rate to a third etch rate, different from the second etch rate, when the second region of the insulator is exposed to the first etch process, the second region being over the second plurality of second protruding structures; and exposing the insulator to the first etch process to expose a first height of respective one of the first plurality of first protruding structures and to expose a second height of respective ones of the second plurality of second protruding structures, the second height being less than the first height.

Yet another general aspect of embodiments disclosed herein includes a device including: a substrate; a first isolation structure and a second isolation structure over the substrate; a first active fin over the substrate and protruding above a first top surface of the first isolation structure; and a second active fin over the substrate and protruding above a second top surface of the second isolation structure, wherein the first top surface of the first isolation structure and the second top surface of the second isolation structure are sloped at an interface between the first isolation structure and the second isolation structure.

Yet another general aspect of embodiments disclosed herein includes a device including: a substrate; a first isolation structure over the substrate, the first isolation structure comprising first dopants; a second isolation structure over the substrate, the second isolation structure comprising second dopants different from the first dopants; a first active fin over the substrate and protruding above a first top surface of the first isolation structure, a first protruding portion of the first active fin having a first height; and a second active fin over the substrate and protruding above a second top surface of the second isolation structure, a second protruding portion of the second active fin having a second height different from the first height.

Yet another general aspect of embodiments disclosed herein includes a device including: a substrate; a first isolation structure over the substrate, the first isolation structure comprising p-type dopants; a second isolation structure over the substrate, the second isolation structure comprising n-type dopants; a first active fin over the substrate and protruding above a first top surface of the first isolation structure, wherein a first acute angle is formed between the first top surface of the first isolation structure and a sidewall of the first active fin; and a second active fin over the substrate and protruding above a second top surface of the second isolation structure, wherein a second acute angle is formed between the second top surface of the second isolation structure and a sidewall of the second active fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a first isolation structure and a second isolation structure over the substrate;
   a first active fin over the substrate and protruding above a first top surface of the first isolation structure; and
   a second active fin over the substrate and protruding above a second top surface of the second isolation structure, wherein the first top surface of the first isolation structure and the second top surface of the second isolation structure are sloped at an interface between the first isolation structure and the second isolation structure.

2. The device of claim 1, wherein the first isolation structure has a first thickness, and wherein the second isolation structure has a second thickness different from the first thickness.

3. The device of claim 1, wherein a first protruding portion of the first active fin has a first height, and wherein a second protruding portion of the second active fin has a second height different from the first height.

4. The device of claim 1, wherein the first isolation structure comprises first dopants, and wherein the second isolation structure comprises second dopants different from the first dopants.

5. The device of claim 1, wherein an acute angle is formed between the first top surface of the first isolation structure and a sidewall of the first active fin.

6. The device of claim 1, further comprising a first dummy fin and a second dummy fin over the substrate, wherein the first isolation structure covers the first dummy fin, and wherein a second isolation structure covers the second dummy fin.

7. The device of claim 6, wherein the first dummy fin has a concave top surface, and wherein the second dummy fin has a convex top surface.

8. A device comprising:
   a substrate;
   a first isolation structure over the substrate, the first isolation structure comprising first dopants;
   a second isolation structure over the substrate, the second isolation structure comprising second dopants different from the first dopants;
   a first active fin over the substrate and protruding above a first top surface of the first isolation structure, a first protruding portion of the first active fin having a first height; and
   a second active fin over the substrate and protruding above a second top surface of the second isolation structure, a second protruding portion of the second active fin having a second height different from the first height, wherein the first top surface of the first isolation structure and the second top surface of the second isolation structure are sloped at an interface between the first isolation structure and the second isolation structure.

9. The device of claim 8, wherein a first acute angle is formed between the first top surface of the first isolation structure and a sidewall of the first active fin.

10. The device of claim 9, wherein a second acute angle is formed between the second top surface of the second isolation structure and a sidewall of the second active fin.

11. The device of claim 9, wherein the first acute angle is between about 35 degrees and about 55 degrees.

12. The device of claim 8, wherein the first isolation structure has a first thickness, and wherein the second isolation structure has a second thickness different from the first thickness.

13. The device of claim 8, wherein the first dopants are p-type dopants, and wherein the second dopants are n-type dopants.

14. A device comprising:
a substrate;
a first isolation structure over the substrate, the first isolation structure comprising p-type dopants;
a second isolation structure over the substrate, the second isolation structure comprising n-type dopants;
a first active fin over the substrate and protruding above a first top surface of the first isolation structure, wherein a first acute angle is formed between the first top surface of the first isolation structure and a sidewall of the first active fin; and
a second active fin over the substrate and protruding above a second top surface of the second isolation structure, wherein a second acute angle is formed between the second top surface of the second isolation structure and a sidewall of the second active fin.

15. The device of claim 14, wherein the first acute angle is between about 35 degrees and about 55 degrees.

16. The device of claim 14, wherein the second acute angle is between about 35 degrees and about 55 degrees.

17. The device of claim 14, wherein the first top surface of the first isolation structure and the second top surface of the second isolation structure are sloped at an interface between the first isolation structure and the second isolation structure.

18. The device of claim 17, wherein the interface between the first isolation structure and the second isolation structure is interposed between the first active fin and the second active fin.

19. The device of claim 14, further comprising a plurality of dummy fins over the substrate and between the first active fin and the second active fin, the first isolation structure covering a first subset of the plurality of dummy fins, the second isolation structure covering a second subset of the plurality of dummy fins, the second subset of the plurality of dummy fins being different from the first subset of the plurality of dummy fins.

20. The device of claim 8, further comprising at least one dummy fin over the substrate and between the first active fin and the second active fin, the first isolation structure extending along sidewalls and a top surface of the at least one dummy fin.

* * * * *